(12) United States Patent
Marques

(10) Patent No.: US 8,115,663 B2
(45) Date of Patent: Feb. 14, 2012

(54) MISMATCH-IMMUNE DIGITAL-TO-ANALOG CONVERTER

(75) Inventor: Joao Pedro Santos Cabrita Marques, Lisbon (PT)

(73) Assignee: Silicon Laboratories Inc., Austin, TX (US)

( * ) Notice: Subject to any disclaimer, the term of this patent is extended or adjusted under 35 U.S.C. 154(b) by 139 days.

(21) Appl. No.: 12/760,187

(22) Filed: Apr. 14, 2010

(65) Prior Publication Data

US 2011/0254720 A1 Oct. 20, 2011

(51) Int. Cl.
*H03M 1/66* (2006.01)
(52) U.S. Cl. .......................... 341/152; 341/144; 341/118
(58) Field of Classification Search .................. 341/118, 341/120, 144, 152, 153, 154
See application file for complete search history.

(56) References Cited

U.S. PATENT DOCUMENTS

| | | | |
|---|---|---|---|
| 4,563,669 A | 1/1986 | Petschacher et al. | |
| 5,610,606 A * | 3/1997 | Fukunaga et al. | ............ 341/152 |
| 5,689,258 A | 11/1997 | Nakamura et al. | |
| 5,901,172 A | 5/1999 | Fontana et al. | |
| 6,104,330 A | 8/2000 | Redman-White et al. | |
| 6,242,974 B1 | 6/2001 | Kunst | |
| 6,583,743 B2 | 6/2003 | Moussavi | |
| 6,992,610 B2 * | 1/2006 | Komarura | ..................... 341/152 |
| 7,034,733 B2 | 4/2006 | Dedic et al. | |
| 7,345,609 B2 | 3/2008 | Briaire | |
| 7,379,714 B2 | 5/2008 | Haque et al. | |
| 7,952,508 B2 * | 5/2011 | Crespi et al. | .................. 341/152 |
| 7,965,214 B2 * | 6/2011 | Khoury et al. | ................ 341/152 |
| 2004/0104833 A1 * | 6/2004 | Lin | ................................ 341/153 |
| 2007/0252739 A1 * | 11/2007 | Carroll | .......................... 341/144 |

OTHER PUBLICATIONS

Hernandez, Hugo; Van Noije, Wilhelmus; and Roa, Elkim; "Design Strategy of Current Source in Current-Steering CMOS DAC," XIII IBERCHIP Workshop, IWS-2007, (2007) 01-04, Lima, Peru, 4 pages.

* cited by examiner

*Primary Examiner* — Howard Williams
(74) *Attorney, Agent, or Firm* — Polansky & Associates, P.L.L.C.; Ronald Michael Reed; Paul J. Polansky

(57) ABSTRACT

In an embodiment, a digital-to-analog converter (DAC) includes inputs for receiving first and second signals encoded as a digital signal pair including overlapping low value portions that are substantially equal in duration to overlapping high value portions, within a frame. The DAC further includes an output terminal for providing an analog signal and includes first and second switches responsive to the first and second signals alter a level of the analog signal based on values of the first and second signals to provide a mismatch-immune DAC functionality. In one instance, the switches couple current sources to a common node. In another instance, the switches configure a resistive network to alter a resistance at an input to an amplifier.

20 Claims, 3 Drawing Sheets

MISMATCH-IMMUNE DIGITAL-TO-ANALOG CONVERTER

FIELD

The present disclosure is generally related to digital-to-analog converters (DACs), and more particularly to mismatch-immune DACs.

BACKGROUND

Pulse width modulation (PWM) systems are often employed to generate analog signals from digital data. PWM signals are used to drive an H-bridge or similar device to be used to drive a headphone amplifier, a Class A, B, AB amplifier, or other circuitry. In some instances, PWM signals are used to drive auxiliary amplifier circuitry to achieve high-power and high-efficiency amplification.

One problem with conventional DACs is that linearity can be difficult to achieve. In particular, circuit component mismatches can introduce dynamic non-linearities in the switching output signal. To achieve a desired signal-to-noise ratio (SNR) and/or signal-to-noise-and-distortion ratio (SNDR) (i.e., linearity), a DAC should be immune to such mismatches.

SUMMARY

In an embodiment, a digital-to-analog converter (DAC) includes inputs for receiving first and second signals encoded as a digital signal pair and an output terminal for providing an analog signal. Within a frame, the first and second signals include overlapping low value portions that are substantially equal in duration to overlapping high value portions. The DAC further includes a first current source, a second current source, and a first switch including a control input for receiving the first signal. The first switch is configured to selectively couple the first current source to one of ground and the output terminal based on a value of the first signal. The DAC also includes a second switch including a control input for receiving the second signal. The second switch is configured to couple the second current source to one of ground and the output terminal based on a value of the second signal. Additionally, the DAC includes a third current source coupled to the output terminal for providing a bias current.

In another embodiment, a DAC includes a differential amplifier having a non-inverting input coupled to ground, an inverting input, and an output for providing an analog signal. The DAC also includes a feedback resistor having a first terminal coupled to the output and a second terminal coupled to the inverting input and a bias resistor having a first terminal coupled to a positive supply terminal and a second terminal coupled to the inverting input. The DAC further includes first and second inputs for receiving first and second signals, respectively. The first and second signals correspond to an encoded signal pair, which include overlapping low value portions that are substantially equal in duration to overlapping high value portions within a frame. Further, the DAC includes a resistive network having a plurality of resistors and a respective plurality of switches. Each resistor includes a first terminal coupled to the inverting input and a second terminal coupled to one of the switches. Each switch is responsive to one of the first and second signals to selectively couple the resistor to one of the positive supply terminal and a negative supply terminal to alter a voltage applied to the inverting input.

In still another embodiment, a method of providing an analog output signal includes receiving first and second signals encoded such that, within a frame, the first and second signals include overlapping low value portions that are substantially equal in duration to overlapping high value portions. The method further includes applying the first signal to a control terminal of a first switch and the second signal to a control terminal of a second switch to alter a current provided to a common node and producing the analog output signal as a function of the current (or voltage) at the common node.

DETAILED DESCRIPTION OF ILLUSTRATIVE EMBODIMENTS

A digital-to-analog converter (DAC) is described below that converts PWM signals, such as B-D modulated PWM signals, into an analog signal. In the embodiments depicted in FIGS. 4 and 5 below, the DAC provides three output levels, and can be described as a 1.5 bit DAC with virtually unlimited accuracy, limited only by noise and not device matching.

Figure 1:
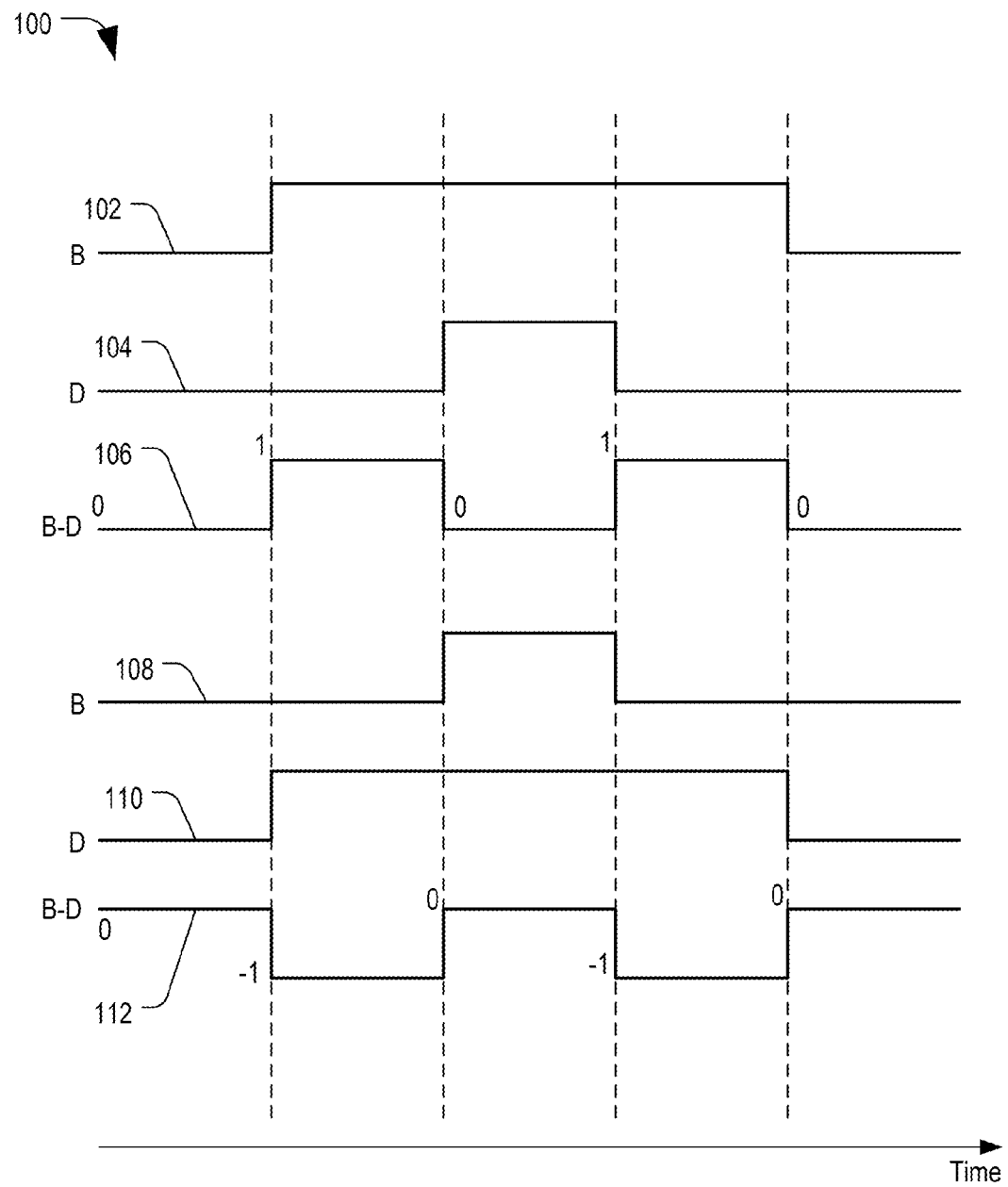
FIG. 1 is a timing diagram of a representative example of B-D modulated signals for a pulse-width-modulated (PWM) system.

FIG. 1 is a timing diagram 100 of a representative example of B-D modulated signals for a pulse-width-modulated (PWM) system. Diagram 100 includes a B signal 102, a D-signal 104, and a differential B-D output signal 106 for a positive output signal. Further, diagram 100 illustrates B signal 108, D signal 110, and differential B-D output signal 112 for a negative output signal. In both cases, differential B-D output signals 106 and 112 represent signals formed by subtracting the B signals 102 and 108 from their respective D signals 104 and 110. The resulting output signals 106 and 112 have three possible voltage levels: a first level indicating a negative one (−1), a second level indicating a zero (0), and a third level indicating a positive one (+1).

In an example, the DAC characteristic is defined by the positive and negative levels. Preferably, the zero value would always fall at a level that is halfway between the positive and negative values. If the desired level of zero is achieved, then the DAC can achieve arbitrarily high linearity.

However, if the DAC is designed such that the level of the zero value is offset from the desired level of zero, the zero value can be in error. For example, in a resistor string DAC implementation, any mismatch between the nominally equal resistors can produce an erroneous zero value. An example of such a resister string DAC implementation is described below with respect to FIG. 2.

Figure 2:
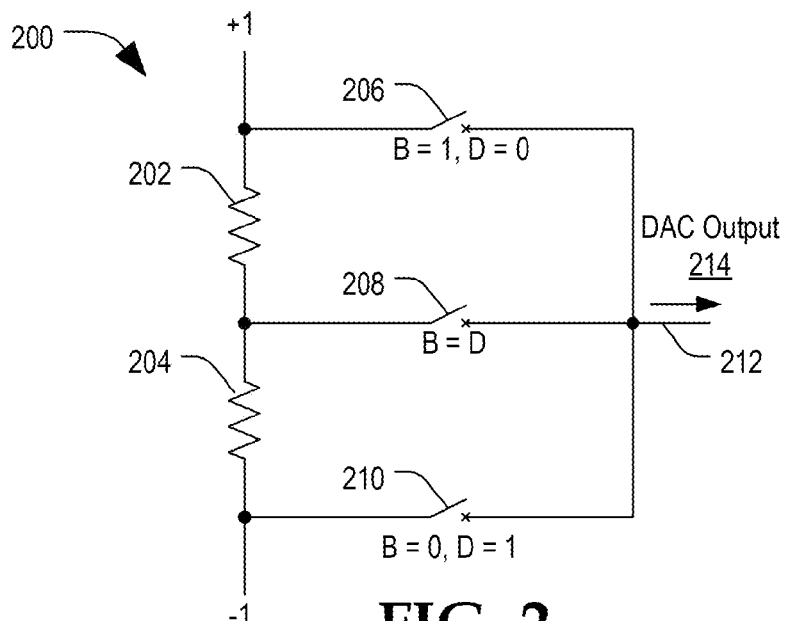
FIG. 2 is a schematic diagram of a representative embodiment of a conventional resistor-string DAC, which can be used to convert the digital B-D modulated signals of FIG. 1 into an analog output, which may have an error due to resistor mismatches.

FIG. 2 is a schematic diagram of a representative embodiment of a conventional resistor-string DAC 200, which can be used to convert the digital B-D modulated signals of FIG. 1 into an analog output, which may have an error due to resistor mismatches. DAC 200 includes a nominally equal resistors 202 and 204 arranged in series between a positive one (+1) voltage terminal and a negative one (−1) voltage terminal. DAC 200 further includes a switch 206 with a first terminal connected to the positive one voltage terminal and a second terminal connected to an output terminal 212, which carries a DAC output signal 214. DAC 200 also includes a switch 208 with a first terminal connected between resistors 202 and 204 and a second terminal connected to output terminal 212. DAC 200 further includes a switch 210 including a first terminal connected to the negative voltage terminal and a second terminal connected to output terminal 212.

In operation, if the two nominally equal resistors 202 and 204 are mismatched, then the zero level will be misaligned, resulting in an offset error from the zero level. Accordingly, during operation, the DAC will produce a non-linearity in the DAC output signal 214.

While a resistive-string DAC approach is described above with respect to FIG. 2, analogous topologies can be conceived, such as traditional switched-capacitor DACs and current mode DACs, which have similar mismatch issues. With such mismatch-prone techniques, conventional design approaches include circuitry or functionality designed to mitigate mismatches, such as calibration (periodic or at power up) or dynamic element matching. However, it is possible to achieve ideally perfect linearity without such additional circuitry. Embodiments of mismatch-immune DACs are described below with respect to FIGS. 4 and 5 that can achieve such linearity.

Figure 3:
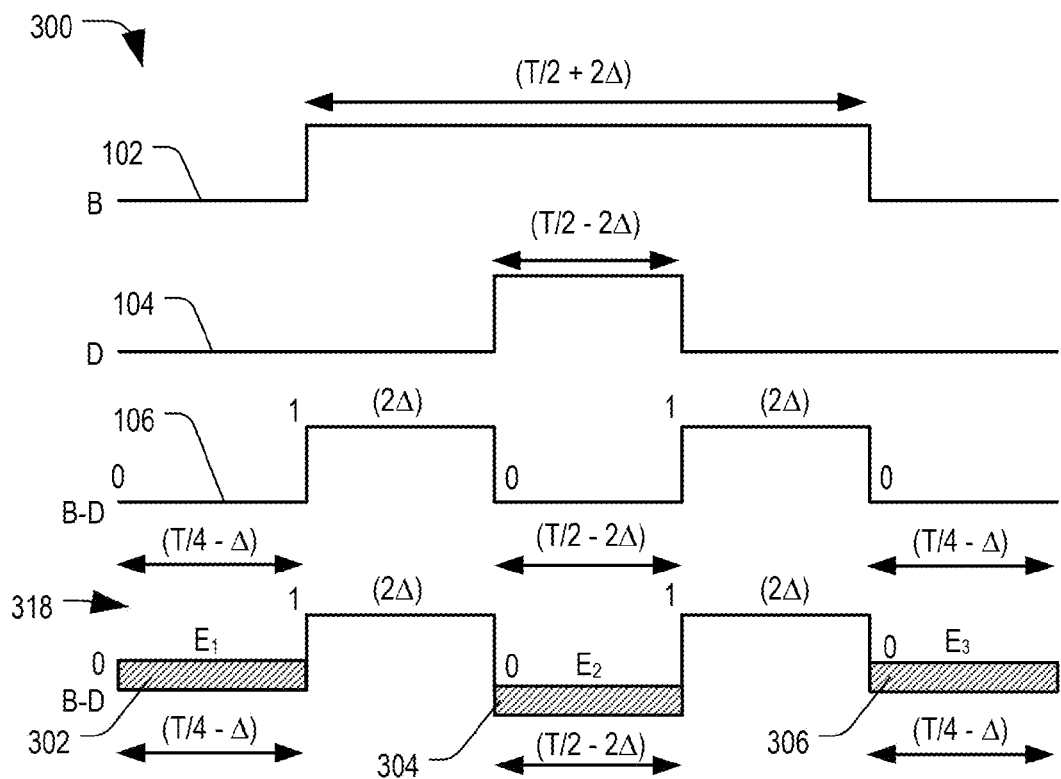
FIG. 3 is a timing diagram of a representative example of a zero-level error from positive and negative zeros due to resistive mismatches in the resistor string DAC of FIG. 2 when B-D modulated signals are applied.

FIG. 3 is a timing diagram 300 of a representative example of a zero-level error from positive and negative zeros due to resistive mismatches in the resistor string DAC of FIG. 2 when B,D modulated signals are applied. In B-D modulation, the desired analog signal is encoded in the pulse width differences between the B signal and the D signal. Typically, half the desired analog level is encoded by increasing the width of the pulse of B signal 102 by an amount (2Δ) and by decreasing the width of the pulse of D signal 104 by the amount (2Δ), for positive signals. For negative signals, the roles of the B signal 102 and the D signal 104 are reversed.

For a zero value analog signal, the pulse widths of B signal 102 and D signal 104 are identically equal to half the frame period (i.e. T/2). As depicted in FIG. 3, the total duration of the "positive zero" portion of the analog signal is always equal to the total duration of the "negative zero" during a single frame. Since PWM reconstruction works on the principle of integrating the area of the pulses to form the baseband signal, if the areas due to the errors in the positive versus negative zeros sum to zero, then no net error is produced in the baseband signal.

In the illustrated diagram 300 of FIG. 3, DAC output current 318 includes "positive zeros" indicated by errors ($E_1$ and $E_3$) 302 and 306, which occur when the B signal and the D signal are both equal to zero. The total error attributable to the positive zeros in a given frame can be calculated according to Equation 1 below.

$$E1+E3=2*(T/4-\Delta)*(+\Delta V)=(T/2-2\Delta)*(+\Delta V) \quad (1)$$

A "negative zero" is produced when the B signal equals the D signal, which equals a one value. The negative zero error ($E_2$) is generally indicated at 304. The negative zero error can be calculated according to Equation 2 below.

$$E2=(T/2-2\Delta)*(-\Delta V) \quad (2)$$

For B, D encoded PWM signals, within a PWM frame, high portions of the B signal 102 may overlap with high portions of the D signal 104. Similarly, low portions of the B signal 102 may overlap with low portions of the D signal 104. As used herein, overlapping portions of the signals 102 and 104 are those portions where the signals 102 and 104 have substantially equal values. In an example, within the PWM frame, the B, D encoded PWM signals include overlapping low-value portions that are substantially equal in duration to the overlapping high-value portions.

For equal and opposite amplitude errors, the positive and negative zero errors cancel each other out, such that $E1+E2+E3=0$. As previously mentioned, the positive and negative zero cancellation technique is not restricted to B-D modulation, but other forms of PWM modulation will work equally well. Further, there is nothing to prevent one or both of the B signal and the D signal from being delayed or advanced from the PWM frame center.

Figure 4:
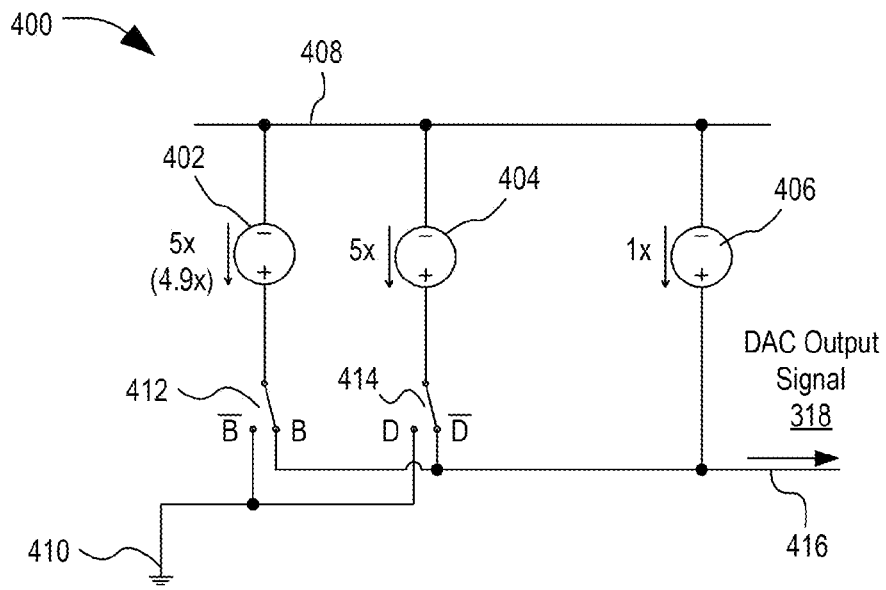
FIG. 4 is a diagram of an embodiment of a switched current DAC that is mismatch immune and configured to provide an output current.

There are many possible circuit embodiments based on the above description. One embodiment using a current mode DAC is shown in FIG. 4. The DAC directly receives the B and D PWM signals and their complements from the digital logic. The DAC then steers the current to either the DAC output for reconstruction filtering or is dumped to ground. The rightmost current source is never switched on or off, but rather simply injects a DC current level for biasing an offset level.

FIG. 4 is a diagram of an embodiment of a switched current DAC 400 that is mismatch immune and configured to provide an output current. DAC 400 includes current sources 402, 404, and 406, where current sources 402 and 404 are greater than and proportional to the current source 406. Each of the current sources 402, 404, and 406 have a negative terminal connected to a supply terminal 408. Current source 402 includes a positive terminal connected to a first terminal of a switch 412, which includes a second terminal connected to ground and a third terminal connected to DAC output 416. Current source 404 includes a positive terminal connected to a first terminal of switch 414, which includes a second terminal connected to ground and a third terminal connected to DAC output 416. Current source 406 includes a second terminal connected to DAC output 416.

In operation, DAC 400 directly receives the B signal 102 and the D signal 104 and their complements from digital logic. The DAC 400 then steers the current either to the DAC output 416 for reconstruction filtering or to ground. Current source 406 is not turned on or off, but rather is used to inject a DC current level for biasing an offset level. Table 1 below depicts an example of the ideal current output and the actual current output for DAC 400, where the variable (x) represents a reference current.

TABLE 1

| B | D | Iout-ideal | Iout-actual |
|---|---|------------|-------------|
| 1 | 0 | 11x        | 10.9x       |
| 1 | 1 | 6x         | 5.9x        |
| 0 | 0 | 6x         | 6x          |
| 0 | 1 | 1x         | 1x          |

In Table 1, when both the B signal 102 and the D signal 104 are equal, the ideal output is the sum of current source 406 and one of the current sources 402 or 404, resulting in an ideal output current of 6x. The actual output current is off by approximately 0.1x when both the B signal and the D signal are equal to one.

The outputs can be scaled and shifted as depicted below in Table 2.

TABLE 2

| B | D | Iout-ideal | Iout-actual |
|---|---|------------|-------------|
| 1 | 0 | 5          | 4.95        |
| 1 | 1 | 0          | −0.05       |
| 0 | 0 | 0          | 0.05        |
| 0 | 1 | −5         | −4.95       |

Scaled and shifted output currents in Table 2 provide positive and negative zeros with equal and opposite errors, which cancel each other. The only residual result of the mismatch of current sources is that the overall gain of the DAC 400 is slightly reduced, but linearity is preserved.

It should be noted that errors in the 1x current source 406 will have no impact on linearity, since current source 406 is used as a bias offset. Any errors in current source 406 would impact the overall gain but would not affect the linearity of the system.

Various other DAC implementations are possible that provide this self-cancelling effect. One example of another possible DAC implementation out of many that can provide such self-cancelling effects is described below with respect to FIG. 5.

Figure 5:
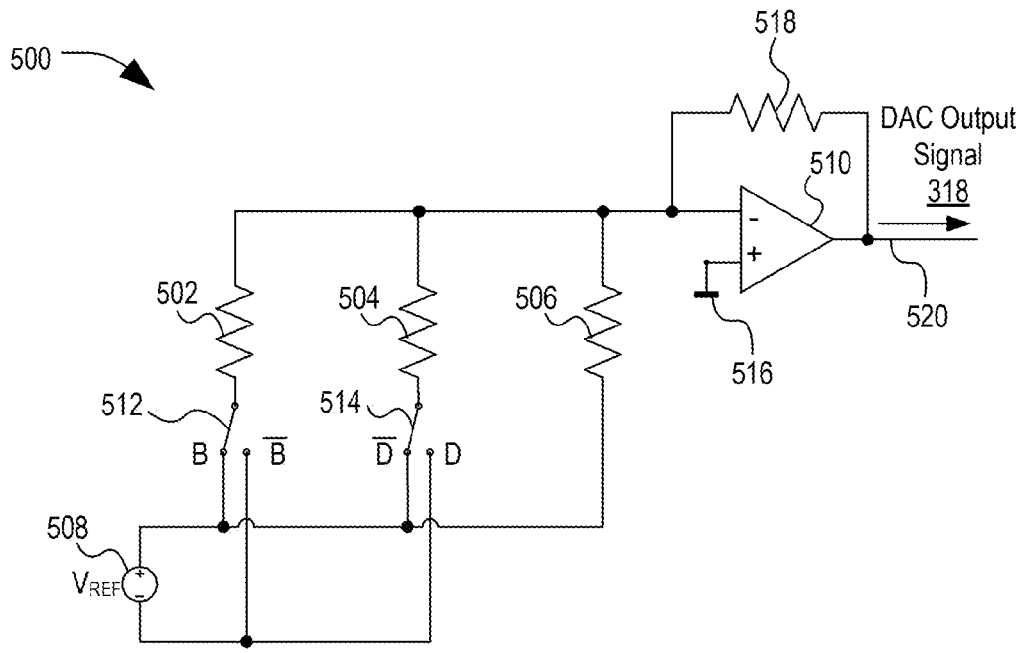
FIG. 5 is a diagram of another embodiment of a resistive network DAC that is mismatch immune and configured to provide an output voltage.

FIG. 5 is a diagram of another embodiment of a DAC 500 that is mismatch immune and configured to provide an output voltage. DAC 500 includes resistors 502, 504, and 506, which have first terminals connected to an inverting input of differential amplifier 510. Resistor 502 includes a second terminal connected to a switch 512, which includes a second terminal connected to a positive terminal of a reference voltage supply 508 and a third terminal connected to a negative terminal of the reference voltage supply 508. Resistor 504 includes a second terminal connected to a switch 514, which includes a second terminal connected to a positive terminal of a reference voltage supply 508 and a third terminal connected to a negative terminal of the reference voltage supply 508. Resistor 506 includes a second terminal connected to the positive terminal of reference voltage supply 508. DAC 500 further includes a resistor 518 having a first terminal connected to DAC output 520 and a second terminal connected to the inverting input of amplifier 510, which includes a non-inverting input connected to a second power supply terminal, such as ground.

In operation, DAC 500 directly receives the B signal 102 and the D signal 104 and their complements from digital logic, which signals 102 and 104 are applied to switches 512 and 514, respectively. Switches 512 and 514 are connected to the positive or negative supply terminals of reference voltage supply 508 based on the value of the respective signals 102 and 104. Depending on the connection of the switches 512 and 514, the value of the resistive network coupled to the inverting input of amplifier 510 varies, thereby changing the output voltage. Resistor 506 remains connected to the inverting input of amplifier 510 to inject a DC bias current for biasing an offset level. As in the DAC 400 depicted in FIG. 4, DAC 500 produces two zeros (positive and negative) with substantially equal and opposite errors, resulting in resistive mismatch immunity over a sequence of digital input values.

In a particular example, resistors 502 and 504 can have nominally equal resistances, which are proportional to and larger than resistor 506, providing a variable current divider circuit to provide a desired current to the inverting input of amplifier 510 in response to the B signal 102 and the D signal 104. In an alternative embodiment, resistors 502 and 504 may be proportional to and smaller than resistor 506 to provide greater current flow variability depending on the values of the B and D signals 102 and 104.

In the illustrated embodiment of FIG. 5, any component mismatch produces an equal and opposite error at both positive and negative zero values, thereby cancelling any zero errors and preserving linearity. In this implementation, by scaling the value of resistor 518 to achieve a desired gain, any reduction in the overall gain of DAC 500 can be erased.

While the above-examples have largely focused on examples that produce analog output signals in response to B and D PWM encoded signals, it should be understood that the above-described methods and circuits can be applied to other differentially-encoded digital signals to produce an analog output signal. In particular, the above-described methods and circuits can be applied to encoded digital signals that, within a frame, include overlapping low value portions that are substantially equal in duration to overlapping high value portions.

In conjunction with the description of FIGS. 4 and 5, a mismatch-immune DAC is disclosed that includes inputs for receiving differentially-encoded digital signals and for producing an analog output signal that is mismatch-immune. In particular, the differentially-encoded digital signal is converted into an analog output signal having a logic high level, a logic low level, and two zero values. To the extent that the two zero values have errors relative to a midlevel value or zero value, the errors are substantially equal and opposite to one another, canceling each other out. In one embodiment, the DAC includes a bias current source connected to an output terminal and a plurality of selectable current sources that can be connected to the output terminal through a respective plurality of switches in response to differentially-encoded signals.

In another embodiment, the DAC includes a bias resistor connected to a positive supply terminal and includes plurality of resistors. Each of the plurality of resistors has one terminal connected to an inverting input of a differential amplifier and a second terminal connected to one of the positive supply terminal and a negative supply terminal through a respective plurality of switches in response to the differentially-encoded signals.

Although the present invention has been described with reference to preferred embodiments, workers skilled in the art will recognize that changes may be made in form and detail without departing from the scope of the invention.

What is claimed is:

1. A digital-to-analog converter (DAC) comprising:
inputs for receiving first and second signals encoded as a digital signal pair that, within a frame, include overlapping low value portions that are substantially equal in duration to overlapping high value portions;
an output terminal for providing an analog signal;
a first current source;
a second current source;
a first switch including a control input for receiving the first signal, the first switch configured to selectively couple the first current source to one of ground and the output terminal based on a value of the first signal; and
a second switch including a control input for receiving the second signal, the second switch configured to couple the second current source to one of ground and the output terminal based on a value of the second signal; and
a third current source coupled to the output terminal for providing a bias current.

2. The DAC of claim 1, wherein the first and second switches operate to produce the analog signal having one of four output voltage levels representing three logic levels.

3. The DAC of claim 2, wherein the four output voltage levels include a logic high level, a logic low level, a positive zero level, and a negative zero level.

4. The DAC of claim 3, wherein the positive and negative zero levels have equal and opposite errors relative to an ideal zero value.

5. The DAC of claim 3, wherein a frame rate of the first and second signals is greater than a data rate of the first and second signals.

6. The DAC of claim 1, wherein the first current source and the second current sources provide respective first and second currents that are greater than and substantially proportional to the bias current.

7. The DAC of claim 6, wherein the first and second currents are approximately five times greater than the bias current.

8. The DAC of claim 1, wherein the first and second signals comprise B and D pulse width modulated (PWM) signals representing differentially-encoded signals.

9. A digital-to-analog converter (DAC) comprising:
a differential amplifier including a non-inverting input coupled to ground, an inverting input, and an output for providing an analog signal;
a feedback resistor having a first terminal coupled to the output and a second terminal coupled to the inverting input;
a bias resistor having a first terminal coupled to a positive supply terminal and a second terminal coupled to the inverting input;
first and second inputs for receiving first and second signals, respectively, the first and second signals comprising an encoded signal pair including overlapping low value portions that are substantially equal in duration to overlapping high value portions within a frame;
a resistive network including a plurality of resistors and a respective plurality of switches, each resistor including a first terminal coupled to the inverting input and a second terminal coupled to a corresponding one of the respective plurality of switches, each switch responsive to one of the first and second signals to selectively couple the corresponding resistor to one of the positive supply terminal and a negative supply terminal to alter a voltage applied to the inverting input.

10. The DAC of claim 9, wherein the plurality of resistors comprises:
a first resistor; and
a second resistor;
wherein the first and second resistors have resistance values that are substantially equal to one another and proportional to a resistance of the bias resistor.

11. The DAC of claim 10, wherein the respective plurality of switches comprises:
a first switch including a control terminal for receiving the first signal and configured to selectively couple the first resistor to one of the positive supply terminal and the negative supply terminal based on a value of the first signal; and
a second switch including a control terminal for receiving the second signal and configured to selectively couple the second resistor to one of the positive supply terminal and the negative supply terminal based on a value of the second signal.

12. The DAC of claim 9, wherein a gain of an amplifier circuit comprising the differential amplifier is set by a ratio of the resistances.

13. The DAC of claim 9, wherein the first signal and the second signal comprise differential pulse-width modulated (PWM) signals.

14. A method of providing an analog output signal, the method comprising:
receiving first and second signals having overlapping low value portions that are substantially equal in duration to overlapping high value portions within a frame;
applying the first signal to a control terminal of a first switch and the second signal to a control terminal of a second switch to alter a current provided to a common node; and
providing the current into the common node to an output terminal as the analog output signal.

15. The method of claim 14, wherein applying the first signal to a control terminal of a first switch and the second signal to a control terminal of a second switch comprises:
selectively coupling a first current source to one of ground and the common node based on a value of the first signal using the first switch; and
selectively coupling a second current source to one of ground and the common node based on a value of the second signal using the second switch.

16. The method of claim 14, wherein applying the first signal to a control terminal of a first switch and the second signal to a control terminal of a second switch comprises:
selectively altering an effective resistance associated with a resistive network.

17. The method of claim 16, further comprising:
amplifying a voltage at the common node to produce the analog output signal based on a ratio between a feedback resistor and the effective resistance of the resistive network.

18. The method of claim 14, wherein applying the first signal to a control terminal of a first switch and the second signal to a control terminal of a second switch comprises:
selectively coupling a first terminal of a first resistor to one of a negative power supply terminal and a positive power supply terminal based on a value of the first signal using the first switch, the first resistor including a second terminal coupled to the common node; and
selectively coupling a first terminal of a second resistor to one of the negative power supply terminal and the positive power supply terminal based on a value of the second signal using the second switch, the second resistor including a second terminal coupled to the common node.

19. The method of claim 14, wherein the first and second signals comprise differentially encoded pulse-width modulated signals.

20. The method of claim 14, wherein the analog output signal is capable of assuming a first voltage level, a second voltage level, a positive zero voltage level, and a negative zero voltage level; and
wherein the positive and negative zero voltage levels have substantially equal and opposite errors relative to a mid-level between the first and second voltage levels.

* * * * *